US008500461B2

(12) United States Patent
Tseng et al.

(10) Patent No.: US 8,500,461 B2
(45) Date of Patent: Aug. 6, 2013

(54) CONNECTOR MECHANISM FOR CONNECTING A BOARD CARD

(75) Inventors: Tien-Chung Tseng, New Taipei (TW); Chun-Ming Wu, New Taipei (TW)

(73) Assignee: Wistron Corporation, Xizhi Dist., New Taipei (TW)

( * ) Notice: Subject to any disclaimer, the term of this patent is extended or adjusted under 35 U.S.C. 154(b) by 0 days.

(21) Appl. No.: 13/445,943

(22) Filed: Apr. 13, 2012

(65) Prior Publication Data
US 2012/0302073 A1 Nov. 29, 2012

(30) Foreign Application Priority Data

May 26, 2011 (TW) .............................. 100209449 A

(51) Int. Cl.
*H01R 12/00* (2006.01)
(52) U.S. Cl.
USPC ........................................................... 439/74
(58) Field of Classification Search
USPC ............... 439/65, 76.1, 676, 92, 344, 98, 66, 439/620, 941, 540.1, 74, 326
See application file for complete search history.

(56) References Cited

U.S. PATENT DOCUMENTS

| | | | | |
|---|---|---|---|---|
| 4,678,252 A * | 7/1987 | Moore | .............................. | 439/62 |
| 5,268,820 A * | 12/1993 | Tseng et al. | .................. | 361/785 |
| 6,048,221 A * | 4/2000 | McCleerey et al. | ............ | 439/326 |
| 6,692,310 B2 * | 2/2004 | Zaderej et al. | ................ | 439/701 |
| 6,728,110 B2 * | 4/2004 | Koyama | ........................ | 361/752 |
| 7,182,618 B1 * | 2/2007 | Choy et al. | ..................... | 439/328 |
| 7,217,148 B1 * | 5/2007 | Chen | .............................. | 439/326 |
| 7,220,142 B2 * | 5/2007 | Liang | ............................ | 439/326 |
| 7,252,231 B2 * | 8/2007 | Ho | ................................. | 235/441 |
| 7,300,298 B2 * | 11/2007 | Kameda | ....................... | 439/326 |
| 8,130,489 B2 * | 3/2012 | Chan et al. | ............... | 361/679.32 |
| 2007/0249188 A1 * | 10/2007 | Mueller et al. | ................ | 439/76.1 |
| 2008/0101049 A1 * | 5/2008 | Casto et al. | ..................... | 361/788 |
| 2008/0147930 A1 * | 6/2008 | Su | .................................... | 710/74 |
| 2008/0207020 A1 * | 8/2008 | Decker et al. | ................... | 439/78 |
| 2011/0228469 A1 * | 9/2011 | Sun | .......................... | 361/679.33 |
| 2012/0302073 A1 * | 11/2012 | Tseng et al. | .................... | 439/65 |

* cited by examiner

*Primary Examiner* — Neil Abrams
*Assistant Examiner* — Phuongchi T Nguyen
(74) *Attorney, Agent, or Firm* — Winston Hsu; Scott Margo

(57) ABSTRACT

A connector mechanism for connecting a board card is disclosed. The connector mechanism includes a circuit board whereon at least one metal contact is formed, and a connector installed on the circuit board. An end of the board card is for inserting into the connector. The connector mechanism further includes at least one signal transmitting component fixed on the other end of the board card and electrically connected to the board card. The at least one signal transmitting component includes at least one conductive clip for resiliently contacting the at least one metal contact on the circuit board as the end of the board card is inserted into the connector so as to electrically connect to the circuit board.

6 Claims, 5 Drawing Sheets

CONNECTOR MECHANISM FOR CONNECTING A BOARD CARD

BACKGROUND OF THE INVENTION

1. Field of the Invention

The present invention relates to a connector mechanism for connecting a board card, and more specifically, to a connector mechanism utilizing conductive clips for electrically contacting metal contacts as connection interface.

2. Description of the Prior Art

Portable computers, such as notebook computers and tablet computers, are now commonly used for personal computing. Because they are small and light, notebook computers are suitable to be taken out of the home or office for document processing. Because wireless transmission techniques are maturing, hard-wired connections with electric network lines are no longer needed to transmit electrical signals, and signals may be received or transmitted from anywhere in a wireless manner by an antenna. In general, a wireless network card can transmit wireless signals conforming to corresponding specification. Cables are often utilized to connect the antenna module and the wireless network card in conventional mechanical design of a connector of the wireless network card. However, it often decays signal intensity and increases manufacture cost, assembly labor hour and assembly complexity. Furthermore, the cables might be broken as passing through a hinge connection of a display device and a host. For solving the above-mentioned problems, the antenna can be disposed on a circuit board for reducing signal decay, manufacture cost, assembly labor hour and assembly complexity and for protecting wires thereof. However, distances between joints of the wireless network cards conforming to different specification for connecting the antennas are not uniform, and the connector structure and the circuit board are needed to be redesigned and remolded as applying for the wireless network cards conforming to different specification so as to reduce utilization flexibility of the conventional connector mechanism.

SUMMARY OF THE INVENTION

The present invention provides a connector mechanism utilizing conductive clips for electrically contacting metal contacts as connection interface, to solve the problems mentioned above.

According to the claimed invention, a connector mechanism for connecting a board card is disclosed. The connector mechanism includes a circuit board whereon at least one metal contact is formed, and a connector installed on the circuit board. An end of the board card is for inserting into the connector. The connector mechanism further includes at least one signal transmitting component fixed on the other end of the board card and electrically connected to the board card. The at least one signal transmitting component includes at least one conductive clip for resiliently contacting the at least one metal contact on the circuit board as the end of the board card is inserted into the connector so as to electrically connect to the circuit board.

According to the claimed invention, the at least one metal contact includes an annular metal contact and a circular metal contact disposed on an inner side of the annular metal contact, and the at least one conductive clip includes a U-shaped conductive clip and a strip conductive clip for resiliently contacting the annular metal contact and the circular metal contact, respectively.

According to the claimed invention, the annular metal contact and the circular metal contact are arranged to form a concentric structure.

According to the claimed invention, the at least one signal transmitting component includes a base, the at least one conductive clip being installed on a side of the base, an annular terminal installed on the other side of the base and electrically connected to the U-shaped conductive clip, and a pin terminal installed on the other side of the base and electrically connected to the strip conductive clip.

According to the claimed invention, the annular terminal and the pin terminal of the at least one signal transmitting component are in male/female combination with the board card.

According to the claimed invention, the connector mechanism further includes a fastening component for fastening the board card on the circuit board as the board card is substantially parallel with the circuit board.

According to the claimed invention, at least one antenna printed circuit is disposed on the circuit board and coupled to the at least one metal contact.

The connection mechanism of the present invention applies for mechanical design of the antenna directly disposed on the circuit board, and it can reduce signal decay, save manufacture cost, reduce assembly labor hour and assembly complexity, and prevent an issue of broken cables. Furthermore, the annular metal contact and the circular metal contact can be designed to be larger than the U-shaped conductive clip and the strip conductive clip respectively and the annular metal contact and the circular metal contact can be arranged to form a concentric structure, so it can absorb influence of assembly tolerance. Furthermore, the connector mechanism of the present invention can adjust relative position of the detachable signal transmitting components thereof for suiting with the corresponding board card. Hence, it can solve the problem that the conventional connector structure and the circuit board are needed to be redesigned and remolded as applying for the wireless network cards conforming to different specification, and it enhances utilization flexibility of the connector mechanism of the present invention.

These and other objectives of the present invention will no doubt become obvious to those of ordinary skill in the art after reading the following detailed description of the embodiment that is illustrated in the various figures and drawings.

DETAILED DESCRIPTION

Figure 1:
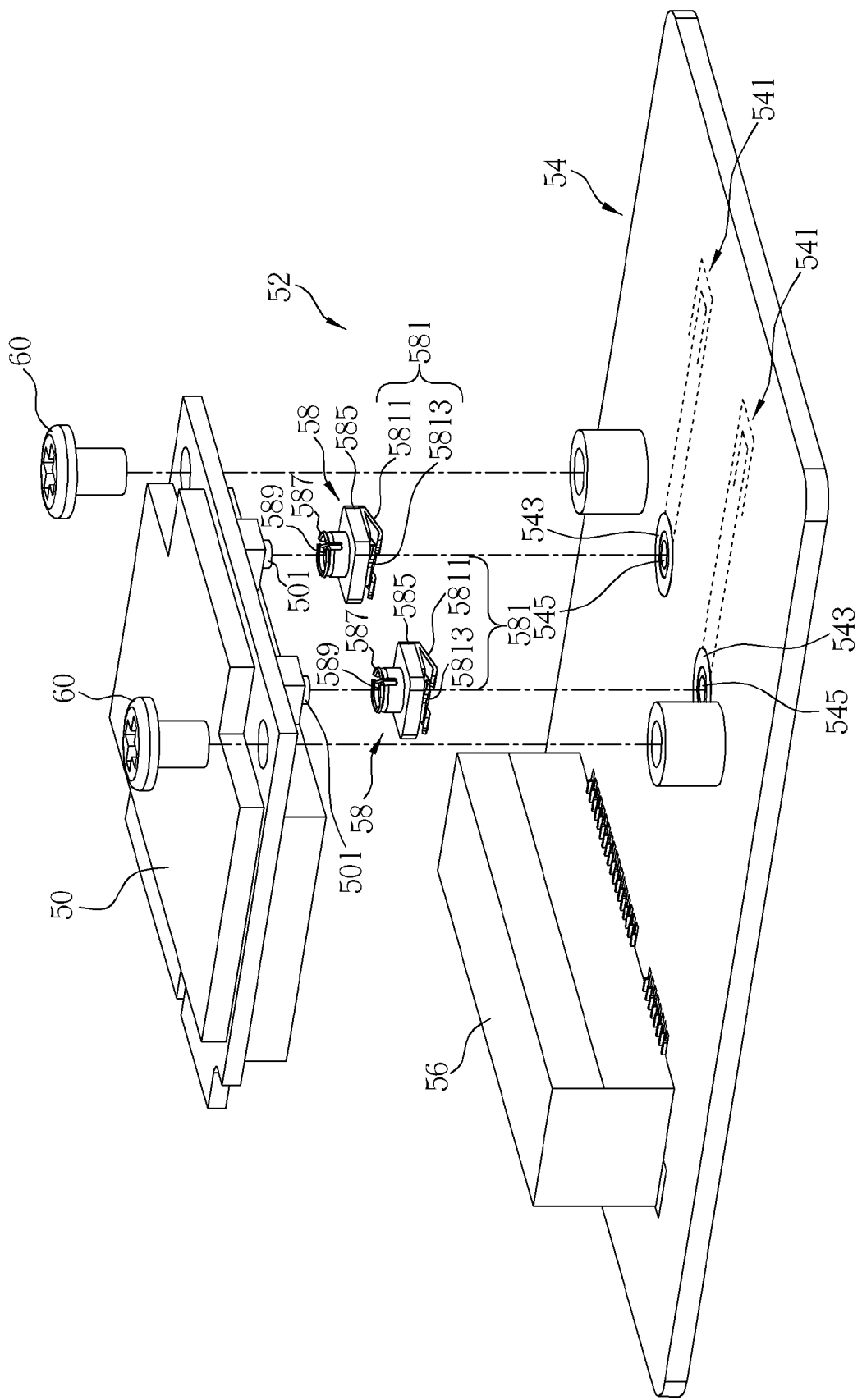
FIG. 1 is an exploded drawing of a connector mechanism for connecting a board card according to an embodiment of the present invention.
Figure 2:
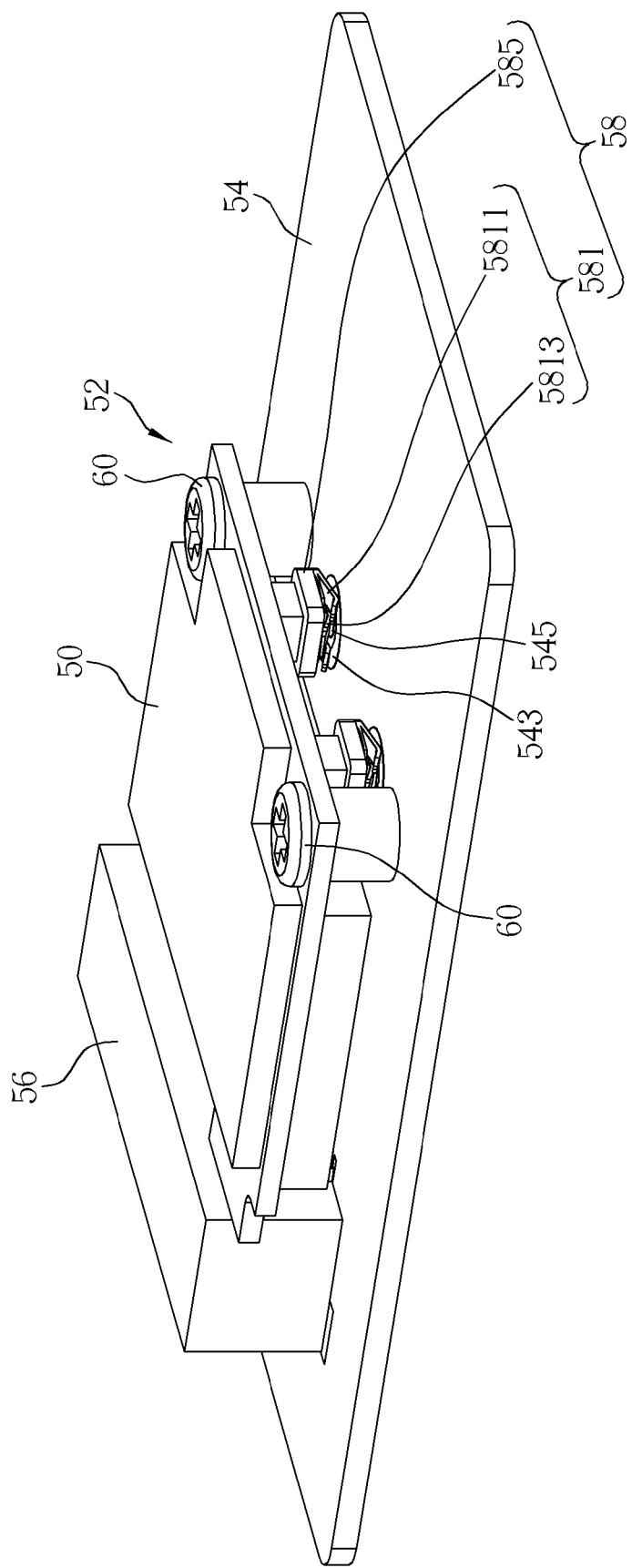
FIG. 2 is an assembly drawing of the board card and the connector mechanism according to the embodiment of the present invention.

Please refer to FIG. 1 and FIG. 2. FIG. 1 is an exploded drawing of a connector mechanism 52 for connecting a board card 50 according to an embodiment of the present invention. FIG. 2 is an assembly drawing of the board card 50 and the connector mechanism 52 according to the embodiment of the present invention. The board card 50 can be a wireless network card, such as a wireless local area network (WLAN) card or a wireless wide area network (WWAN) card and so on, and can be installed inside a notebook computer. The connector mechanism 52 includes a circuit board 54, which can be a printed circuit board. At least one antenna printed circuit 541 can be disposed on the circuit board 54 for receiving and transmitting wireless signals. At least one metal contact is formed on the circuit board 54 and coupled to the antenna printed circuit 541. For example, two sets of annular metal contacts 543 and circular metal contacts 545 can be formed on the circuit board 54. The circular metal contact 545 is disposed on an inner side of the annular metal contact 543, and the annular metal contact 543 and the circular metal contact 545 can be arranged to form a concentric structure. The disposal and amount of the metal contact are not limited to those of the embodiment, and it depends on actual design demand. Furthermore, the annular metal contact 543 can be coupled to a grounding terminal for grounding, and the circular metal contact 545 can be used for transmitting electrical signals. The connector mechanism 52 further includes a connector 56 installed on the circuit board 54, and an end of the board card 50 is for inserting into the connector 56 to transmit signals with the circuit board 54.

Figure 3:
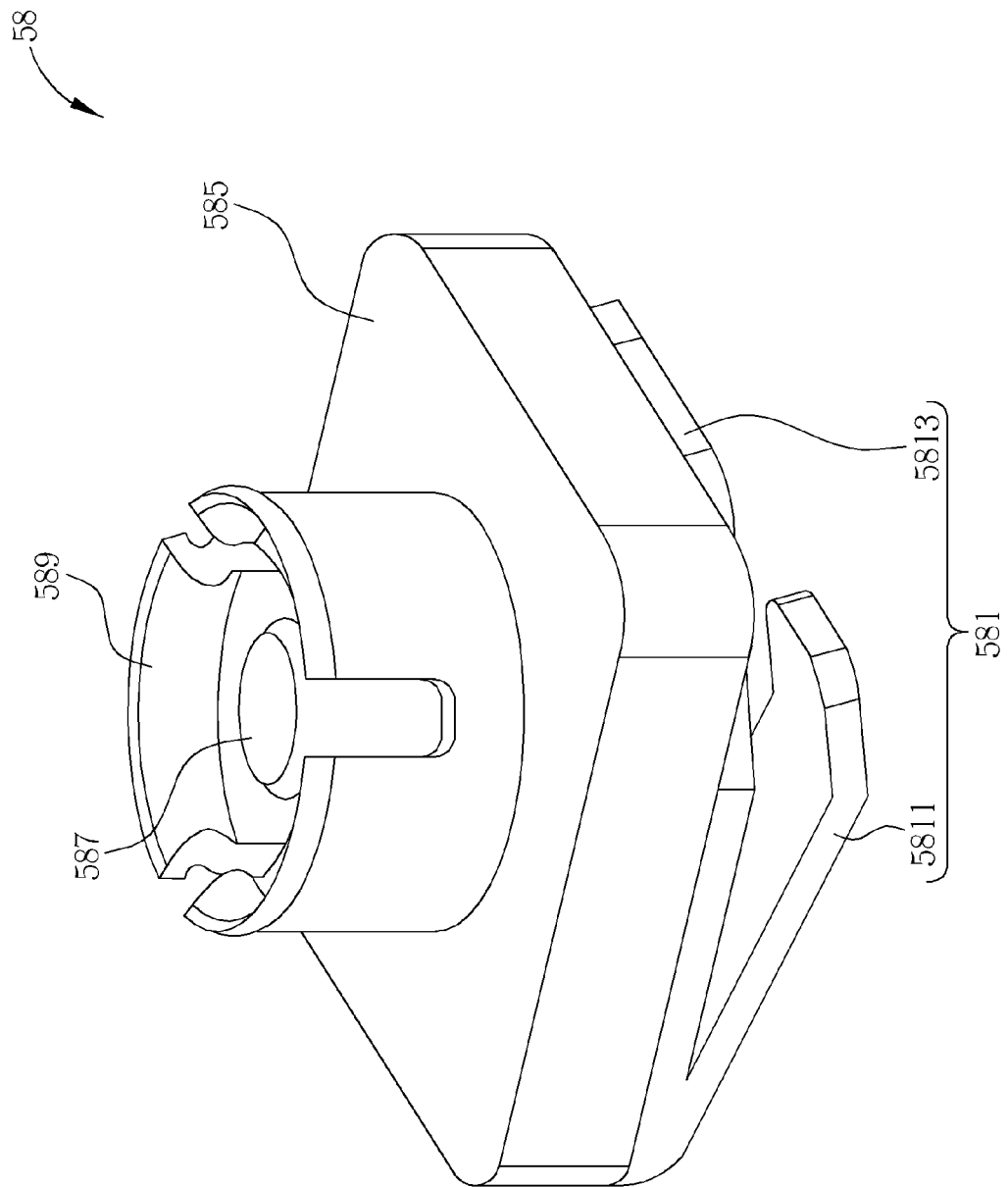
FIG. 3 and FIG. 4 are diagrams of a signal transmitting component in different views according to the embodiment of the present invention.
Figure 4:
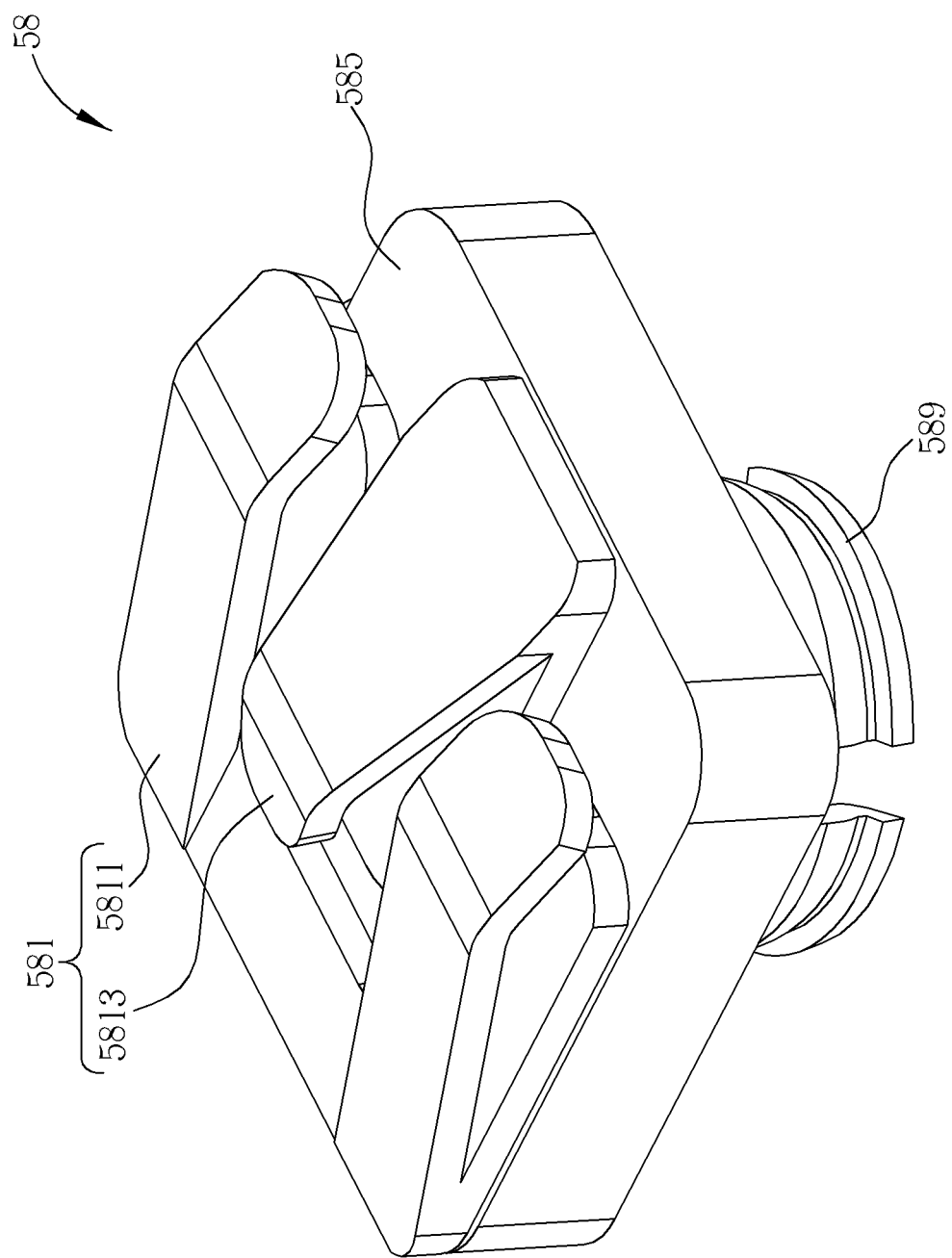
Figure 5:
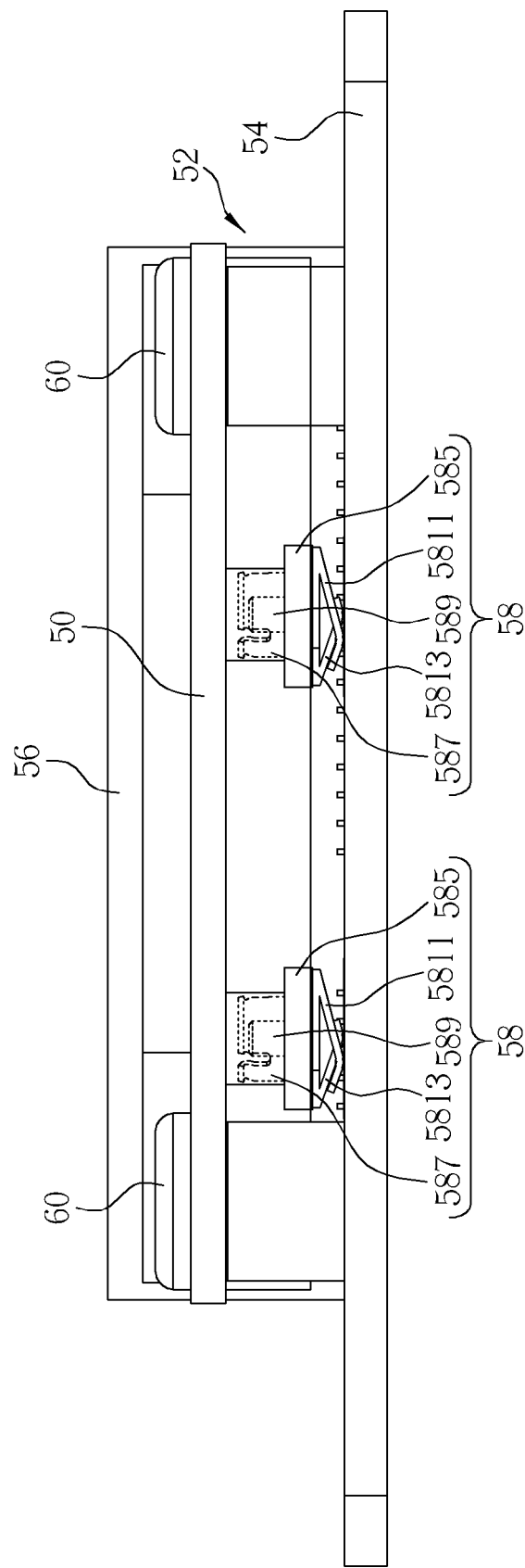
FIG. 5 is a sectional view of the connector mechanism according to the embodiment of the present invention.

The connector mechanism 52 further includes at least one signal transmitting component 58 fixed on the other end of the board card 50 and electrically connected to the board card 50. In this embodiment, the connector mechanism 52 includes two signal transmitting components 58 for respectively contacting the two sets of the annular metal contacts 543 and the circular metal contacts 545. The disposal and amount of the signal transmitting components 58 are not limited to those of the embodiment, and it depends on actual design demand. Please refer to FIG. 1 to FIG. 5. FIG. 3 and FIG. 4 are diagrams of the signal transmitting component 58 in different views according to the embodiment of the present invention. FIG. 5 is a sectional view of the connector mechanism 52 according to the embodiment of the present invention. Each signal transmitting component 58 includes at least one conductive clip 581 for resiliently contacting the at least one metal contact (the annular metal contacts 543 and the circular metal contacts 545) on the circuit board 54 as the end of the board card 50 is inserted into the connector 56 and the board card 50 is substantially parallel with the circuit board 54 so as to electrically connect the antenna printed circuit 541 on the circuit board 54, so that the board card 50 and the antenna printed circuit 541 on the circuit board 54 can transmit signals with each other. For example each conductive clip 581 can include a U-shaped conductive clip 5811 and a strip conductive clip 5813, for resiliently contacting the annular metal contact 543 and the circular metal contact 545 respectively, as the end of the board card 50 is inserted into the connector 56 and the board card 50 is substantially parallel with the circuit board 54. The disposal and amount of the conductive clip 581 are not limited to those of the embodiment, and it depends on actual design demand.

In addition, each signal transmitting component 58 further includes a base 585 for supporting the U-shaped conductive clip 5811 and the strip conductive clip 5813. That is, the U-shaped conductive clip 5811 and the strip conductive clip 5813 are installed on a side of the base 585. The base 585 can be made of non-conductive material, such as plastic material. Each signal transmitting component 58 further includes an annular terminal 587 installed on the other side of the base 585 and electrically connected to the U-shaped conductive clip 5811, and a pin terminal 589 installed on the other side of the base 585 and electrically connected to the strip conductive clip 5813. The annular terminal 587 and the pin terminal 589 of the signal transmitting component 58 are in male/female combination with the board card 50, so as to electrically conduct two metal contacts 501 of the board card 50 with the annular metal contact 543 and the circular metal contact 545 on the circuit board 54. Furthermore, the connector mechanism 52 further includes at least one fastening component 60 for fastening the board card 50 on the circuit board 54 as the board card 50 is substantially parallel with the circuit board 54, so as to fix the board card 50. The fastening component 60 can include combination of a screw and a boss. In this embodiment, the connector mechanism 52 includes two fastening components 60 for respectively fastening two sides of the board card 50. The disposal and amount of the fastening component 60 are not limited to those of the embodiment, and it depends on actual design demand.

After the annular terminal 587 and the pin terminal 589 of the signal transmitting component 58 are in male/female combination with the board card 50, the end of the board card 50 can be inserted into the connector 56 and the board card 50 is substantially parallel with the circuit board 54. At this time, the U-shaped conductive clip 5811 and the strip conductive clip 5813 resiliently contact the annular metal contact 543 and the circular metal contact 545 on the circuit board 54 respectively, so that the board card 50 and the antenna printed circuit 541 on the circuit board 54 can transmit signals with each other. Then, the two fastening components 60 can be used for fastening the two sides of the board card 50 so as to fix the board card 50 on the circuit board 54. Because the annular metal contact 543 and the circular metal contact 545 can be arranged to form the concentric structure, there is no limitation in assembly direction of the annular terminal 587 and the pin terminal 589 of the signal transmitting component 58 being installed on the board card 50, so as to enhance assembly convenience. Furthermore, the annular metal contact 543 and the circular metal contact 545 can be designed to be larger than the U-shaped conductive clip 5811 and the strip conductive clip 5813 respectively, so as to ensure the electrical contact of the annular metal contact 543 and the U-shaped conductive clip 5811, and of the circular metal contact 545 and the strip conductive clip 5813 without influence of assembly tolerance, even the connector mechanism 52 is for connecting the board cards 50 connected to the two signal transmitting components 58 with different distances therebetween conforming to different specification. Besides, the relative position of the detachable signal transmitting components 58 of the present invention can be adjusted for respectively contacting with the corresponding metal contacts 501 on the board card 50 as the connector mechanism 52 is for connecting the board cards 50 having the two metal contacts 501 with different distances therebetween conforming to different specification. It can solve the problem that the conventional connector structure and the circuit board are needed to be redesigned and remolded as applying for the wireless network cards conforming to different specification, and it enhances utilization flexibility of the connector mechanism 52 of the present invention.

In contrast to the prior art, the connection mechanism of the present invention applies for mechanical design of the antenna directly disposed on the circuit board, and it can reduce signal decay, save manufacture cost, reduce assembly labor hour and assembly complexity, and prevent an issue of broken cables. Furthermore, the annular metal contact and the circular metal contact can be designed to be larger than the U-shaped conductive clip and the strip conductive clip respectively and the annular metal contact and the circular metal contact can be arranged to form the concentric structure, so it can absorb influence of assembly tolerance. Furthermore, the connector mechanism of the present invention can adjust relative position of the detachable signal transmitting components thereof for suiting with the corresponding board card. Hence, it can solve the problem that the conventional connector structure and the circuit board are needed to be redesigned and remolded as applying for the wireless network cards conforming to different specification, and it enhances utilization flexibility of the connector mechanism of the present invention.

Those skilled in the art will readily observe that numerous modifications and alterations of the device and method may be made while retaining the teachings of the invention.

What is claimed is:

1. A connector mechanism for connecting a board card, comprising:
   a circuit board whereon at least one metal contact is formed;
   a connector installed on the circuit board, an end of the board card being for inserting into the connector; and
   at least one signal transmitting component fixed on the other end of the board card and electrically connected to the board card, the at least one signal transmitting component comprising at least one conductive clip for resiliently contacting the at least one metal contact on the circuit board as the end of the board card is inserted into the connector so as to electrically connect to the circuit board; wherein the at least one metal contact comprises an annular metal contact and a circular metal contact disposed on an inner side of the annular metal contact, and the at least one conductive clip comprises a U-shaped conductive clip and a strip conductive clip for resiliently contacting the annular metal contact and the circular metal contact, respectively.

2. The connector mechanism of claim 1, wherein the annular metal contact and the circular metal contact are arranged to form a concentric structure.

3. The connector mechanism of claim 1, further comprising at least one fastening component for fastening the board card on the circuit board as the board card is substantially parallel with the circuit board.

4. The connector mechanism of claim 1, wherein at least one antenna printed circuit is disposed on the circuit board and coupled to the at least one metal contact.

5. The connector mechanism of claim 1, wherein the at least one signal transmitting component comprises:
   a base, the at least one conductive clip being installed on a side of the base;
   an annular terminal installed on the other side of the base and electrically connected to the U-shaped conductive clip; and
   a pin terminal installed on the other side of the base and electrically connected to the strip conductive clip.

6. The connector mechanism of claim 5, wherein the annular terminal and the pin terminal of the at least one signal transmitting component are in male/female combination with the board card.

* * * * *